United States Patent [19]

Granahan et al.

[11] 4,164,433

[45] Aug. 14, 1979

[54] TUBE SKIN THERMOCOUPLES AND METHOD OF MAKING SAME

[75] Inventors: Edward A. Granahan, Richmond; Carrold H. Paulson, Jr., Palatine, both of Ill.

[73] Assignee: Pneumo Corporation, Boston, Mass.

[21] Appl. No.: 903,168

[22] Filed: May 5, 1978

[51] Int. Cl.² .......................................... H01L 35/02
[52] U.S. Cl. ..................................... 136/229; 29/573; 73/359 R; 136/232; 136/233; 136/242
[58] Field of Search ...................... 29/573; 73/359 R; 136/229, 232, 233, 242

[56] References Cited

U.S. PATENT DOCUMENTS 4,114,444  9/1978  Schwenninger et al. ......... 73/359 R

FOREIGN PATENT DOCUMENTS 957429  5/1964  United Kingdom ................. 73/359 R

OTHER PUBLICATIONS

Eller et al., Electrical World, Sep. 5, 1960, p. 45.

Primary Examiner—Leland A. Sebastian
Attorney, Agent, or Firm—Maky, Renner, Otto & Boisselle

[57] ABSTRACT

A tube skin thermocouple assembly and method of making same, characterized by a sheathed thermocouple cable having an angularly disposed sensing end terminating in an end face extending substantially parallel to the axis of the adjacent axial portion of the sheath. A measuring junction of the conductors is formed in an end cavity in the sensing end substantially free of insulating material and filled with filler metal embedding the measuring junction therein, the filler metal thus providing an end closure having an exposed face substantially flush with the end face and forming therewith a contact face adapted for contiguous intimate contact with a tube surface. The end closure may be of a large mass of filler metal for direct welding of the sensing end of the assembly to the tube, and the contact face may be either flush with or slightly offset from the outer diameter of the adjacent axial portion of the sheath, respectively, for flush or radially spaced axial mounting of the assembly on the tube. Alternatively, where the contact face is flush with the outer diameter of the adjacent axial portion of the sheath, the sensing end may be removably mounted by a strap welded to the tube having an intermediate portion conformed to the shape of the outer or external surface of the angularly disposed sensing end to receive and maintain the sensing end in intimate contact with the tube surface.

20 Claims, 10 Drawing Figures

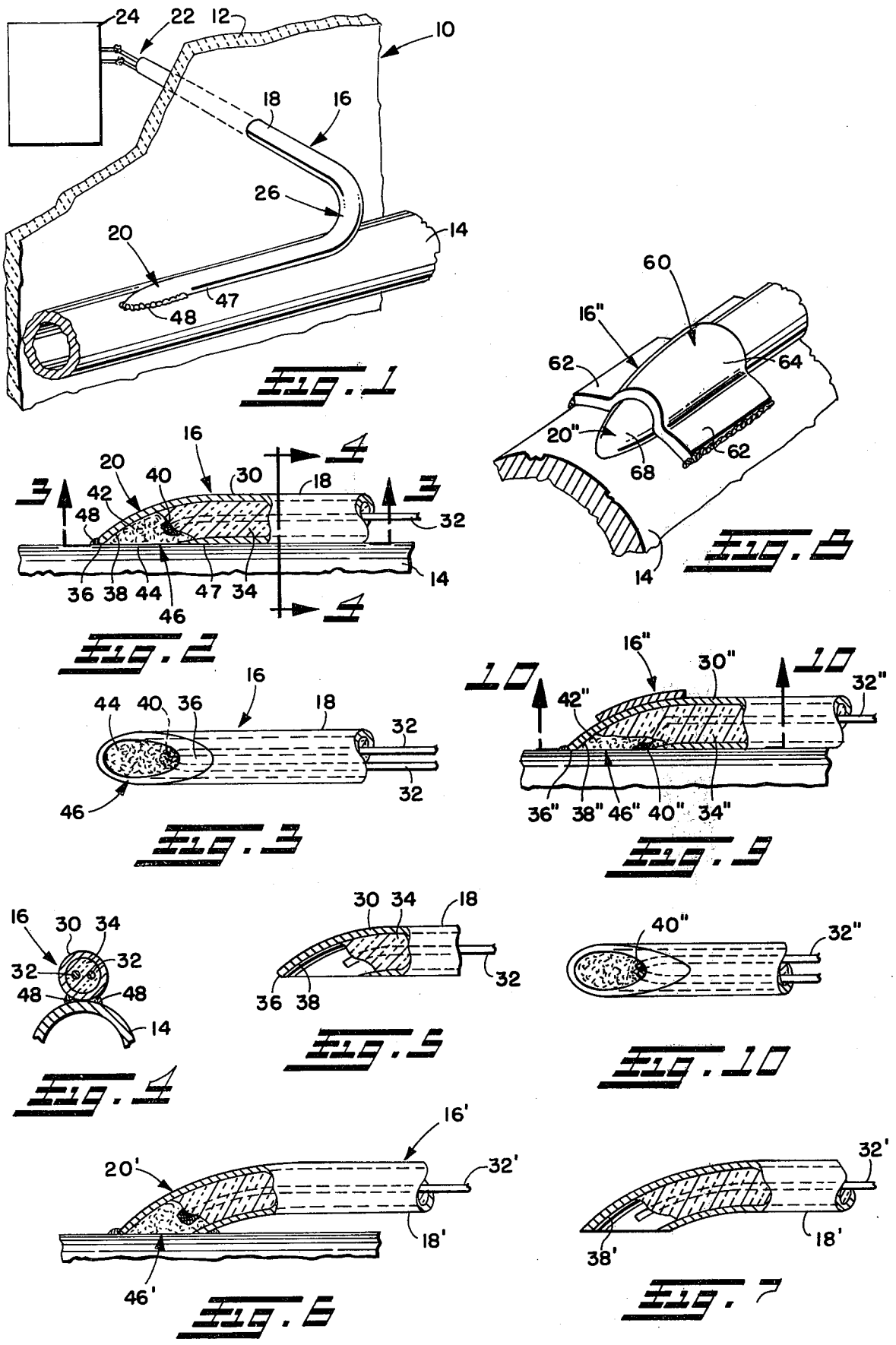

TUBE SKIN THERMOCOUPLES AND METHOD OF MAKING SAME

BACKGROUND

This invention relates generally to a thermocouple assembly for measuring surface temperatures of tubes and the like, its method of fabrication, and its installation.

In many instances, it is desirable to measure the temperature of a material within a closed tube, such as a tube of a heat exchanger. Accurate temperature measurements have been difficult to obtain because it often is impractical to insert a measuring device through the tube wall for direct measurement of the material temperature. It therefore has been necessary to rely on sensing the temperature of the exterior surface of the tube wall which is indicative of the temperature of the material within the tube. For this purpose, tube skin or surface thermocouple assemblies have been utilized on the skin or exterior surface of the tube to sense the surface temperature of the tube wall.

Many factors, however, make it difficult to obtain accurate temperature measurements of the tubes' exterior surface with such assemblies. The sensing ends of the thermocouple assemblies must be mounted on the exterior surfaces of the tubes where they are subjected to severe environmental conditions, such as high temperature gases and flames. These gases and flames may be of significantly higher temperature than that of the tubes at the points of measurement, and the responsiveness of such thermocouple assemblies may be adversely affected by such higher temperatures.

The effects of the external environmental conditions on thermocouple measurements may be reduced by bringing the measuring junction of the assembly into as intimate contact as possible with the surface of the tube whose temperature is to be sensed and in some way protect or shield the measuring junction from the high temperature gases and flames. Heretofore, this has been done by welding the thermocouple assemblies directly to the surface of the tube. However, known thermocouple assemblies have been costly and difficult to manufacture and/or difficult to weld to the tube wall.

One such type of thermocouple assembly which is welded directly to the tube whose surface temperature is to be sensed is illustrated in U.S. Pat. No. 4,043,200. Such assembly shown requires a difficult to perform manufacturing procedure including, among other things, precise bending of the thermocouple wires of a sheathed thermocouple cable for insertion in a ceramic insulating plug and attachment of a large mass of filler metal to the tip of the thermocouple cable and subsequent machining of the same to provide a chisel-shaped section of metal which is used for welding the assembly to the tube. Another known type of thermocouple assembly is illustrated in U.S. Pat. No. 3,143,439 which also requires a difficult to perform manufacturing procedure including, among other things, attachment of a relatively large, shaped pad to a specially formed end of a sheathed thermocouple cable to permit welding of the same directly to the surface of the tube wall.

In contrast to the above-noted thermocouple assemblies which are welded directly to the tube, oftentimes it is desirable to provide a thermocouple assembly which provides for easy removal and replacement of the same on the surface of the tube. Where the thermocouple assembly is welded directly to the tube wall, removal and replacement of the assembly is difficult, and may result in damage to the tube wall and/or the thermocouple assembly itself.

Thermocouple assemblies which may be easily removed and replaced have also been utilized in the past, but, as in the case where the thermocouple assembly is welded directly to the tube wall, such assemblies have been costly and difficult to manufacture, and in many cases do not ensure shielded intimate contact between the measuring or hot junction of the assembly and the surface of the tube whose temperature is to be sensed. One such type of thermocouple assembly is shown in U.S. Pat. No. 2,607,808 which employs a button-type thermocouple element in a sleeve in a generally U-shaped mounting clamp adapted to be removably secured to the tube. Although such device is readily and easily removed, no provision is made to shield adequately the hot junction from its surrounding environment and hot gases may flow beneath the clamp into contact with the thermocouple element thus leading to inaccurate measurement of the temperature of the tube. Another type of thermocouple assembly is illustrated in U.S. Pat. No. 3,907,606 which employs a mounting block welded to the tube surface. The mounting block is provided with a hole into which is inserted the tip of a sheathed thermocouple cable, and which is then peened tight in the hole to secure the tip. By providing a plurality of such holes, the tip of the thermocouple cable can be replaced without the necessity of welding a new block on the tube. However, a hole must be provided in the block before mounting the same for each foreseeable replacement of the thermocouple.

SUMMARY OF THE INVENTION

The present invention provides a surface thermocouple assembly which is less difficult and less expensive to fabricate than prior art assemblies and also provides a short direct heat flow path between the measuring junction and the exterior surface of the tube for accurate temperature measurements. Moreover, the assembly is fabricated so that it can be readily mounted axially with respect to the tube and has a contact face of substantial cross-sectional area contiguous with the exterior surface of the tube which serves to isolate the heat flow path from the effects of the surrounding environment.

The thermocouple assembly of the invention and method of making the same is characterized by a sheathed thermocouple cable including an elongate metallic sheath, a pair of thermocouple conductors or wires extending axially in the sheath and arranged in the sheath and electrically insulated from each other and from the sheath by electrically insulating material. The cable has a sensing end which is angularly disposed relative to the adjacent axial portion thereof and the sheath at the sensing end terminates in an open end face and has an end cavity substantially free of insulating material. The end face is substantially parallel to the axis of the adjacent axial portion of the sheath. A measuring junction of the conductors is formed in the cavity and an end closure of filler metal substantially fills the cavity embedding the measuring junction therein. The end closure has an exposed face substantially flush with the end face of the sheath and forms therewith a contact face adapted for contiguous intimate contact with the tube surface. When installed, the end closure provides a short direct heat path between the measuring junction and surface whose temperature is to be sensed.

According to one form of the invention, the contact face of the assembly is substantially flush with the outer diameter of the adjacent axial portion of the sheath for flush axial mounting of the assembly on the tube. The end closure is of substantial thickness to provide a large mass of weld metal for welding of the sensing end directly to the tube. Another form of assmebly is substantially the same except that the contact face is slightly offset from the outer diameter of the adjacent axial portion of the sheath such that when mounted axially on the tube by welding, the adjacent axial portion of the sheath is slightly radially spaced away from the tube. According to yet another form of the invention, the thermocouple assembly having the contact face substantially flush with the outer diameter of the adjacent axial portion of the sheath may be mounted on the tube for easy removal and replacement by means of a specially formed holding strap. The strap is welded at its ends directly to the tube and has an intermediate portion conformed to the tapered, curved, outer surface of the sensing end of the assembly. The shape of the sensing end and cooperating intermediate portion of the strap is such as to permit positive mounting of the sensing end by the strap while providing for easy removal and replacement of the assembly.

It is accordingly a principal object of the invention to provide a thermocouple assembly for accurately measuring the surface temperature of tubes and the like which may be readily and easily fabricated at relatively low cost.

Another object of the invention is to provide such an assembly and its installation that has a short direct heat flow path between the measuring junction and tube surface when mounted on the latter.

Yet another object of the invention is to provide a thermocouple assembly which may be installed on tubes with relative ease by welding.

Still another object of the invention is to provide a thermocouple assembly that may be mounted axially with respect to the tube and in flush contiguous relationship with the surface of the tube at a contact face of substantial cross-sectional area.

A further object of the invention is to provide a thermocouple assembly and installation which provides for easy removal and replacement of the assembly.

Other objects and advantages of the present invention will become apparent as the following description proceeds.

To the accomplishment of the foregoing and related ends the invention, then, comprises the features hereinafter fully described and particularly pointed out in the claims, the following description and the annexed drawings setting forth in detail certain illustrative embodiments of the invention, these being indicative, however, of but a few of the various ways in which the principles of the invention may be employed.

BRIEF DESCRIPTION OF THE DRAWING

In the annexed drawing:

FIG. 1 is a fragmented perspective view of a furnace or the like illustrating the installation of one form of thermocouple assembly according to the present invention;

FIG. 2 is a longitudinal sectional view of the sensing end of the assembly of FIG. 1;

FIG. 3 is a view of such sensing end as seen from the plane of the line 3—3 of FIG. 2;

FIG. 4 is a transverse sectional view of such sensing end taken along the plane of the line 4—4 of FIG. 2;

FIG. 5 is a longitudinal sectional view of the sensing end similar to that of FIG. 2, but illustrating the method of fabrication of the same;

FIG. 6 is a longitudinal sectional view similar to FIG. 2, but of another form of thermocouple assembly and installation of the same according to the invention;

FIG. 7 is a longitudinal sectional view of the sensing end of the thermocouple assembly of FIG. 6 illustrating the method of fabrication of the same;

FIG. 8 is a fragmented perspective view of yet another form of thermocouple assembly and installation of the same according to the invention;

FIG. 9 is a longitudinal sectional view of the sensing end of the assembly of FIG. 8; and FIG. 10 is a view of such sensing end as seen from the plane of the line 10—10 of FIG. 9.

DESCRIPTION OF THE PREFERRED EMBODIMENT

Referring now in greater detail to the drawings, and initially to FIG. 1, a typical installation of a thermocouple assembly according to the invention is shown for a heater or furnace or the like. The furnace 10 includes a sidewall 12 defining a combustion chamber in which a heat exchanger tube 14 is located. The thermocouple assembly according to the embodiment illustrated in FIGS. 1-4 is generally indicated by the numeral 16 and includes a sheathed thermocouple cable 18 with a hot junction or sensing end 20 and a cold junction or reference end 22. As illustrated, the sensing end 20 is mounted directly on the external surface of the tube 14 and the thermocouple cable 18 extends initially axially along the tube 14 and then through the furnace sidewall 12 and is connected at its reference end 22 to a temperature recording device 24 or the like. The thermocouple cable 18 may have one or more bends, such as is shown at 26, or may be provided with an expansion loop (not shown) to compensate for relative movement between the furnace sidewall 12 and heat exchanger tube 14 caused by expansion and contraction of the same during operation of the furnace. The thermocouple cable at the furnace wall may also have a sliding fit relative to the wall also to compensate for such relative movement.

The thermocouple cable 18 may be of a common type including an elongate tubular sheath 30 and two thermocouple conductors or wires 32 extending axially in the sheath. The wires 32 are electrically insulated from each other and from the sheath by a suitable ceramic insulation 34, such as compacted magnesium oxide, aluminum oxide or berylium oxide powders. Although any similar type of sheathed thermocouple cable 18 may be used, a preferred type is that commonly sold under the trademark XACTPAK.

The sensing end 20 of the assembly, which is made by performing certain operations on the end of the cable 18 in a manner hereinafter described, is angularly disposed relative to the longitudinal axis of the adjacent axial portion of the cable, and the sheath 30 of the cable terminates in an open end face 36 which is substantially parallel to such axis and has an end cavity 38 substantially free of insulation and opening to the end face. A measuring junction 40 is formed in the cavity by the joining of the conductors 32 therewithin. An end closure 42 of filler metal substantially fills the cavity 38 and encases the measuring junction.

The end closure 42 has an exposed face 44 substantially flush with the end face 36 of the sheath 30 and forms therewith a contact face 46 adapted for contiguous intimate contact with the skin or external surface of the tube 14. In the form of assembly illustrated in FIGS. 1-4, the contact face 46 is flat and substantially flush with the outer diameter or exterior surface of the adjacent axial portion 47 of the cable whereby such adjacent axial portion is also contiguous with the tube to facilitate mounting thereof on the tube when installed as shown with the contact face 46 contiguous with the skin or surface of the tube. The sensing end 20 is secured to the tube by the weldment 48 which extends around the periphery of the contact face.

The end closure 42 of filler metal at the sensing end 20 should be of sufficient thickness to provide a relatively large mass of metal for welding of the same to the tube without damage to the measuring junction or surrounding insulation. The end closure 42 should also protect the measuring junction against exposure to the surrounding environment since if exposed it could lead to inaccurate measurements of the tube surface temperature. The sensing end also has a contact face 46 of large cross section area as seen in FIG. 3 with the measuring junction being located inwardly therefrom and somewhat centrally of such face thus to insure that such measuring junction is maintained in relative isolation from external environmental conditions. A short direct solid metal heat path is produced between the measuring junction and the skin of the tube by the end closure 42 of filler metal, thus also to minimize the effect of the environmental conditions surrounding the sensing end and tube, and make the measuring junction directly responsive to the temperature of the tube wall and not the surrounding environment of hot gases and flames.

The method of fabricating the thermocouple assembly will be described with additional reference to FIG. 5. The sensing end 20 of the assembly is first prepared by bending the cable 18 at an angle to the axis of the adjacent axial portion of the cable and cutting off or otherwise removing the distal end portion of the cable substantially along a plane parallel to the axis of the adjacent axial portion, and substantially flush with the outer diameter or exterior surface of such adjacent axial portion. This may conveniently be done by using a suitable bending jig.

Prior to bending, the wires 32 are oriented in a plane parallel to the bending axis. The radius of the bend is preferably substantially greater than that of the sheath to prevent excessive strain in the cable at the sensing end. Moreover, while the cable end may be bent at different angles, an angle bend of approximately 45° is preferably used to provide a contact face 46 of substantial cross section. It will of course be appreciated that the greater the angular bend the less the cross sectional area of the contact face and vice versa.

Following the aforedescribed bending and cutting of the cable end, the insulation material 34 is removed from the open end of the sheath, for example by scraping, from around the ends of the thermocouple wires 32 to form the cavity 38 therein. The wires 32 are then trimmed to project from the insulation only a sufficient distance to permit their joinder by welding to form the measuring junction 40, for example about ⅛" for a ⅜" diameter cable. It is important that the measuring junction 40 be maintained as close to the insulation as possible to prevent damage thereto during subsequent filling of the cavity with filler metal to form the end closure. It will be appreciated that the measuring junction may be easily formed since the relatively large cross-sectional opening at the end of the sheath provides for easy access to the ends of the wires.

To form the end closure 42, the cavity 38 is filled with filler metal. It is important to fill the entire cavity so that voids are not produced therein. Preferably the filler metal is the same as or similar to the sheath metal which has high temperature strength and resistance to corrosion. For example, the sheath and end closure may be stainless steel. Subsequent machining, e.g. sanding, grinding, polishing, etc., may now be done at the sheath end face 36 and exposed face 44 to provide a substantially smooth flat contact face 46 substantially flush with the outer diameter or outer surface of the adjacent unbent portion of the sheath 30.

To complete the fabrication of the assembly, the cold junction end 22 may be formed in conventional manner for suitable connection to the reference meter 24. The assembly may also be provided with bends 26 and/or expansion loops as required. These latter operations are usually performed at the installation site to conform the same to the geometry of the furnace or heater.

The finished thermocouple may now be welded directly to the tube surface by placing the contact face 46 in contiguous relationship therewith with the sensing end 20 and the adjacent portion of the cable 18 extending axially along the length of the tube 14. A single weld pass or several weld passes may be made around the periphery of the contact face.

Referring now to FIGS. 6 and 7, wherein primed reference numerals designate elements corresponding generally to those identified above by the same unprimed reference numerals, another form of thermocouple assembly 16' according to the invention is illustrated. The construction of the assembly 16' is substantially the same as that described above; however, the portion of the thermocouple cable 18' adjacent the sensing end 20' is radially spaced from the tube rather than contiguous therewith. Instead of cutting the bent end of the cable along a plane substantially flush with the outer diameter of the adjacent unbent portion of the cable, the bent end is cut along a plane substantially parallel to the axis of the adjacent unbent portion of the cable but slightly offset from the outer diameter thereof to define an offset contact face 46'. The assembly is otherwise fabricated as described above. When mounted on the tube, the adjacent portion of the cable will extend along the axial length of the tube in spaced radial relation thereto. In some instances, such type of assembly and installation is preferred.

Referring now to FIGS. 8-10, wherein double primed reference numerals designate parts corresponding generally to those identified above by the same but unprimed reference numerals, another form of thermocouple assembly 16" and installation according to the invention are illustrated. It will be appreciated that the shape of the sensing end 20" is substantially identical to that of the thermocouple of FIGS. 1-4, and provides for the proper mounting of the sensing end on the tube wall by means of a carefully formed mounting strap 60 instead of by welding. The strap 60 is welded or otherwise secured at its end portions 62 to the surface of the tube 14 whose temperature is to be sensed. The intermediate portion 64 of the strap is confined to the shape of the tapered, curved exposed surface 68 of the sensing end 20" of the thermocouple assembly 16".

It will be appreciated that the contact face 46" at the sensing end 20" will be maintained in intimate contact with the surface of the tube 14 by the strap 60 without welding the sensing end itself to the tube wall. The sensing end is generally wedge-shaped, and when forced into the cooperatively acting intermediate wedge-shaped portion 64 of the strap, the contact face will be maintained in intimate contact with the tube surface.

Since relative expansion of the strap 60 and sensing end 20" will affect the mounting of the sensing end to the tube, it will be appreciated that the strap may be made of a metal having a thermal coefficient of expansion less than that of the thermocouple. Accordingly, when the assembly is installed when the furnace is cool, the relative expansions of the strap and sensing end under normal operating temperatures will further secure the sensing end to the tube surface.

Although the measuring junction 40" for the thermocouple assembly 16" may be formed as previously described, it is preferred that the construction shown in FIGS. 8–10 be employed. As best seen in FIG. 9, the cavity 38" formed by removing the insulation 34" from the sheath 30" is of a depth substantially equal to the thickness of the sheath wall. The wires 32" are bent downwardly to extend approximately one wire thickness from the end face 36" and then welded to the inner radial edge of the sheath (edge closest to the portion of the sheath) to form the measuring junction 40". The cavity 38" is then filled with filler metal to form the end closure 42" which forms an integral extension of the sheath wall.

It can be appreciated that the measuring junction 40" in this form is even closer to and essentially contacts the tube skin when installed thereon by the strap, and thus provides more accurate measurements of the tube skin temperature. Moreover, the measuring junction is located about the middle of the contact face and thus relatively isolated from the gases and flames of the furnace.

The embodiments of the invention in which an exclusive property or privilege is claimed are defined as follows:

1. A thermocouple assembly comprising:
a sheathed thermocouple cable including an elongate tubular metallic sheath having an axial portion, a pair of axially extending thermocouple conductors in said sheath, and electrically insulating means in said sheath supporting said conductors in electrically insulated spaced relation from each other and from said sheath, said cable having an angularly disposed sensing end, said sheath terminating at said sensing end in an open end face and having an end cavity substantially free of insulating means and opening to said end face, said end face being substantially parallel to the axis of the adjacent axial portion of said sheath;
a measuring junction of said conductors in said cavity; and
an end closure of filler metal substantially filling said cavity embedding said measuring junction therein, said end closure having an exposed face substantially flush with said end face and forming therewith a contact face adapted for contiguous intimate contact with a surface whose temperature is to be sensed when mounted thereon.

2. The assembly of claim 1 wherein said contact face is substantially flush with the outer diameter of the adjacent axial portion of said sheath.

3. The assembly of claim 1 wherein said contact face is slightly offset from the outer diameter of the adjacent axial portion of said sheath whereby said adjacent axial portion of said sheath will be radially spaced from the surface when the sensing end is mounted on the surface.

4. The assembly of claim 2 or 3 wherein said end closure is of sufficient thickness to permit welding of said sensing end to the surface.

5. The assembly of claim 2 or 3 wherein said contact face is oval-shaped and said measuring junction is located above about the middle of said oval-shaped contact face.

6. The assembly of claim 2 or 3 wherein said measuring junction is located proximate said contact face.

7. The assembly of claim 2 wherein said sheath has a sheath wall and said end closure is about the same thickness as said sheath wall.

8. The assembly of claim 7 wherein said end face has a portion adjacent said axial portion of said sheath and said measuring junction is welded to said portion.

9. A thermocouple installation comprising:
a surface whose temperature is to be sensed;
a thermocouple assembly including a sheathed thermocouple cable including an elongate tubular metallic sheath having an axial portion, a pair of axially extending thermocouple conductors in said sheath, and electrically insulating means in said sheath to support and space apart said conductors from each other and from said sheath, said cable having an angularly disposed sensing end, said sheath terminating at said sensing end in an open end face and having an end cavity substantially free of insulating means and opening to said end face, said end face being substantially parallel to the axis of the adjacent axial portion of said sheath;
a measuring junction of said conductors in said cavity;
an end closure of filler metal substantially filling said cavity embedding said measuring junction therein, said end closure having an exposed face substantially flush with said end face and forming therewith a contact face; and
means for mounting said assembly on said surface with said contact face in contiguous intimate contact with said surface.

10. The installation of claim 9 wherein said means for mounting includes directly welding of said sensing end to said surface.

11. The installation of claim 10 wherein said end closure provides a suitable mass of filler metal to facilitate directly welding said sensing end to said surface.

12. The installation of claim 9 wherein said contact face is substantially flush with the outer diameter of said adjacent axial portion, and said means for mounting includes strap means for releasably securing said sensing end to said surface.

13. The installation of claim 12 wherein said sensing end has an exposed external surface opposite said contact face, and said strap means includes a strap having opposite end portions and an intermediate portion, and means for securing said end portions to said surface, said intermediate portion receiving said sensing end and being conformed to said external surface of said sensing end.

14. A method of fabricating a thermocouple assembly comprising the steps of:
  (a) bending one end of an axially extending sheathed thermocouple cable portion including an elongate tubular metallic sheath, a pair of axially extending thermocouple conductors in said sheath, and electrical insulation in said sheath to support and space apart said conductors from each other and from said sheath;
  (b) terminating the bent end along a plane substantially parallel to the axis of the adjacent unbent portion of the sheath;
  (c) removing the insulation from the end of the bent end to form an end cavity substantially free of insulation and open at the end thereof to expose the ends of the thermocouple conductors;
  (d) forming a measuring junction to the conductors in the cavity;
  (e) filling the cavity with filler metal to form an end closure with the measuring junction embedded therein; and
  (f) forming the exposed portions of the end closure and sheath at the terminal end of the bent end to provide a substantially flat contact face adapted for contiguous intimate contact with a surface whose temperature is to be sensed.

15. The method of claim 14 wherein said bent end is terminated along such plane by cutting the cable.

16. The method of claim 14 wherein said bent end is terminated along a plane substantially parallel to the axis of the adjacent unbent portion of the sheath slightly offset from the outer diameter of the adjacent unbent portion of the sheath.

17. The method of claim 14 wherein said bent end is terminated along a plane substantially parallel to the axis of the adjacent unbent portion of the sheath and flush with the outer diameter of the adjacent unbent portion of the sheath.

18. The method of claim 14 wherein said conductors are trimmed to a minimum length needed to form the measuring junction.

19. The method of claim 14 wherein said conductors are bent to extend about one wire thickness from the end of the sensing end adjacent the wall of the sheath nearest the unbent portion and welded to the sheath.

20. The method of claim 14 wherein said wires prior to bending are in a plane normal to the bending axis.

* * * * *